United States Patent
Ying et al.

(10) Patent No.: US 9,653,123 B2
(45) Date of Patent: May 16, 2017

(54) DIRECT DATA CONNECTORS FOR A SEALED DEVICE AND METHODS FOR FORMING A DIRECT DATA CONNECTOR FOR A SEALED DEVICE

(71) Applicant: MARVELL INTERNATIONAL LTD., Hamilton (BM)

(72) Inventors: Ji-Feng Ying, Singapore (SG); Wen Huei Tsai, Singapore (SG)

(73) Assignee: Marvell International LTD., Hamilton (BM)

( * ) Notice: Subject to any disclaimer, the term of this patent is extended or adjusted under 35 U.S.C. 154(b) by 293 days.

(21) Appl. No.: 13/946,804

(22) Filed: Jul. 19, 2013

(65) Prior Publication Data

US 2014/0023823 A1    Jan. 23, 2014

Related U.S. Application Data

(60) Provisional application No. 61/673,758, filed on Jul. 20, 2012.

(51) Int. Cl.
| | | |
|---|---|---|
| *B32B 3/24* | (2006.01) | |
| *G11B 33/12* | (2006.01) | |
| *G11B 33/14* | (2006.01) | |
| *H05K 5/06* | (2006.01) | |

(52) U.S. Cl.
CPC ........ *G11B 33/122* (2013.01); *G11B 33/1466* (2013.01); *H05K 5/069* (2013.01); *Y10T 428/24273* (2015.01); *Y10T 428/24339* (2015.01); *Y10T 428/24347* (2015.01)

(58) Field of Classification Search
CPC .. G11B 33/122; G11B 33/1466; H05K 5/069; Y10T 428/24347; Y10T 428/24339; Y10T 428/24273
See application file for complete search history.

(56) References Cited

U.S. PATENT DOCUMENTS

| | | | |
|---|---|---|---|
| 6,252,779 B1* | 6/2001 | Pierson et al. | 361/774 |
| 7,155,821 B1* | 1/2007 | Downes | H05K 1/112 29/825 |
| 7,365,436 B2* | 4/2008 | Yamano | H01L 21/76898 257/734 |
| 2005/0251597 A1* | 11/2005 | Zhang | G06F 17/30017 710/74 |
| 2006/0002067 A1* | 1/2006 | Gunderson et al. | 361/683 |
| 2008/0114548 A1* | 5/2008 | Pavel et al. | 702/14 |
| 2012/0133047 A1* | 5/2012 | Besling et al. | 257/774 |

* cited by examiner

Primary Examiner — William P Watkins, III

(57) ABSTRACT

According to various embodiments, a method for forming a direct data connector for a sealed device may be provided. The method may include: providing a substrate with a hole; and filling the hole with a filling material using a plating process.

4 Claims, 6 Drawing Sheets

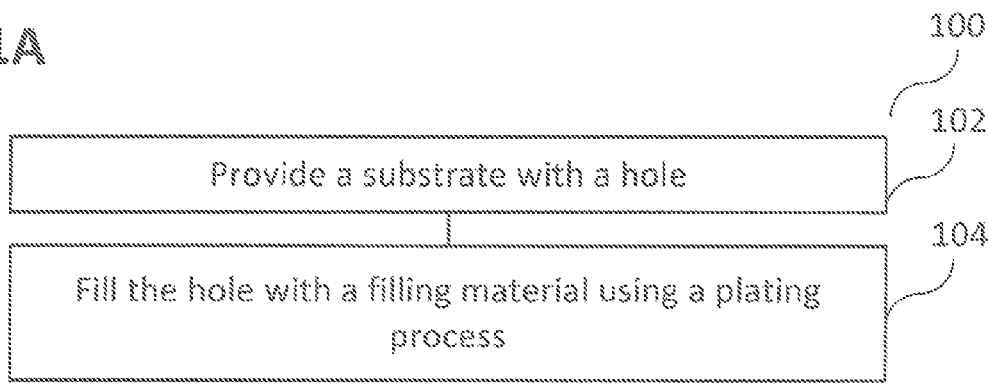
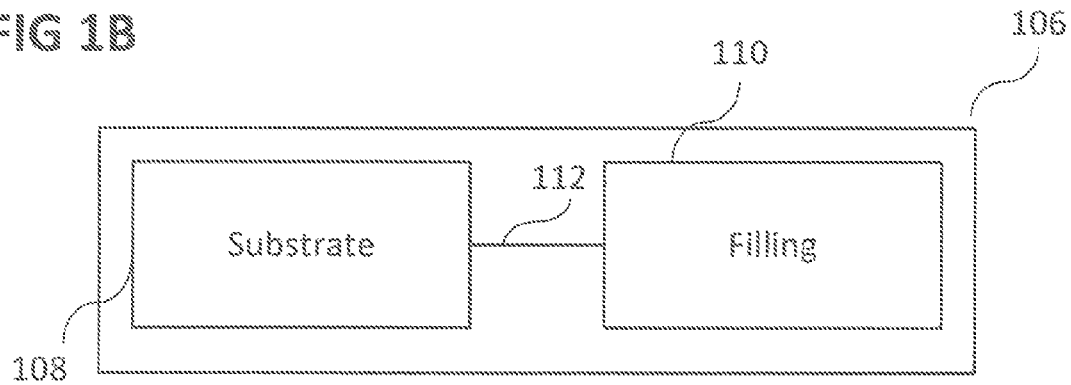
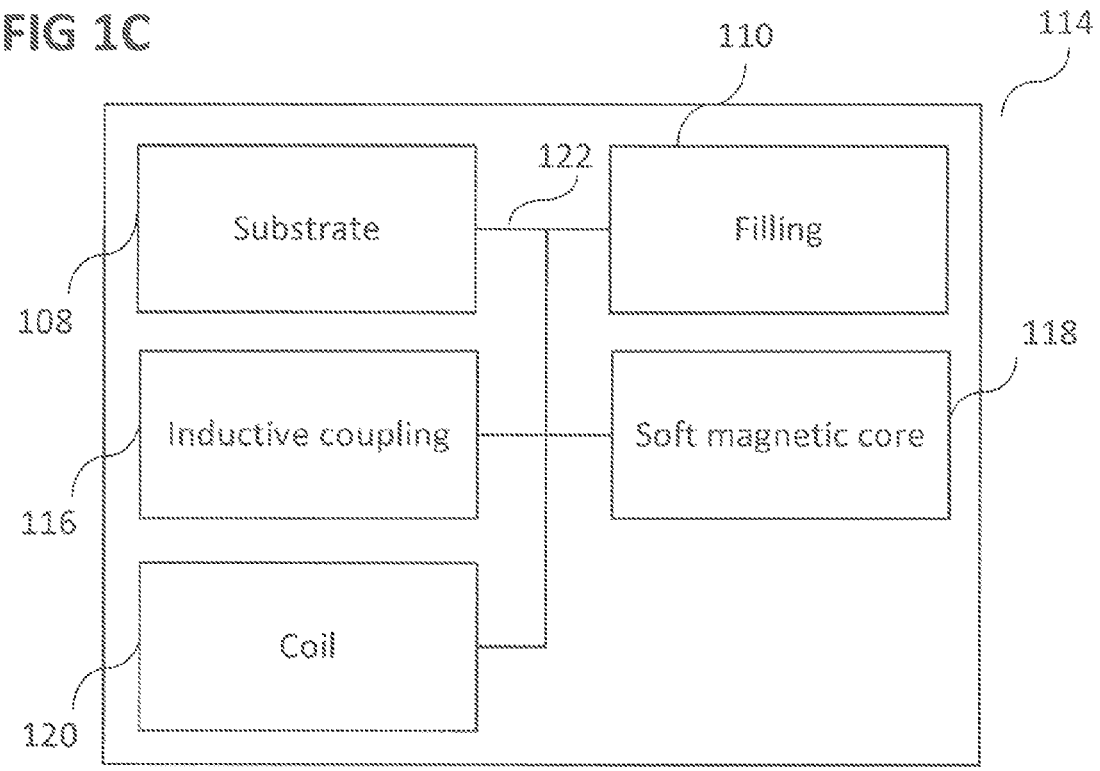

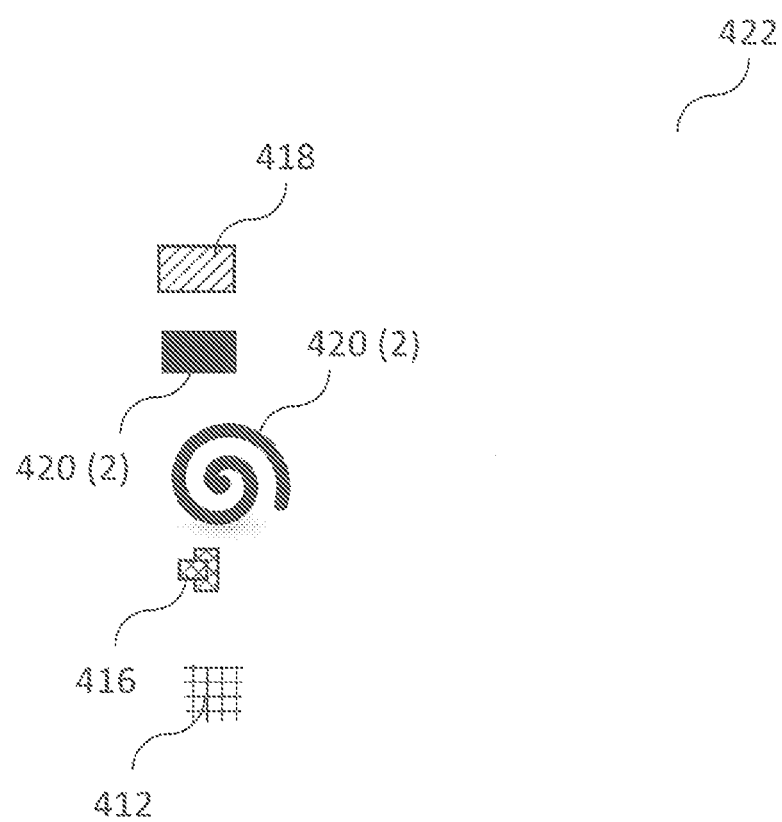

DIRECT DATA CONNECTORS FOR A SEALED DEVICE AND METHODS FOR FORMING A DIRECT DATA CONNECTOR FOR A SEALED DEVICE

CROSS-REFERENCE TO RELATED APPLICATION

The present application claims the benefit of the U.S. provisional patent application No. 61/673,758 filed on 20 Jul. 2012, the entire contents of which are incorporated herein by reference for all purposes.

TECHNICAL FIELD

Embodiments relate generally to direct data connectors for a sealed device and methods for forming a direct data connector for a sealed device.

BACKGROUND

The amount of data to be stored on data storage devices is increasing. Thus, it may be desired to provide data storage devices with a high data storage capacity. One approach to increasing the amount of data that may be stored in hard disk drives is to provide Helium-filled hard disk drives.

SUMMARY

According to various embodiments, a method for forming a direct data connector for a sealed device may be provided. The method may include: providing a substrate with a hole; and filling the hole with a filling material using a plating process.

According to various embodiments, a direct data connector for a sealed device may be provided. The direct data connector may include: a substrate; and a filling in a hole of the substrate, the filling formed using a plating process.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which:

FIG. 1A shows a flow diagram illustrating a method for forming a direct data connector for a sealed device according to various embodiments;

FIG. 1B shows a direct data connector for a sealed device according to various embodiments;

FIG. 1C shows a direct data connector for a sealed device according to various embodiments;

FIG. 4A to FIG. 4D show various stages of an inductively coupled data connector according to various embodiments.

DESCRIPTION

Figure 2:
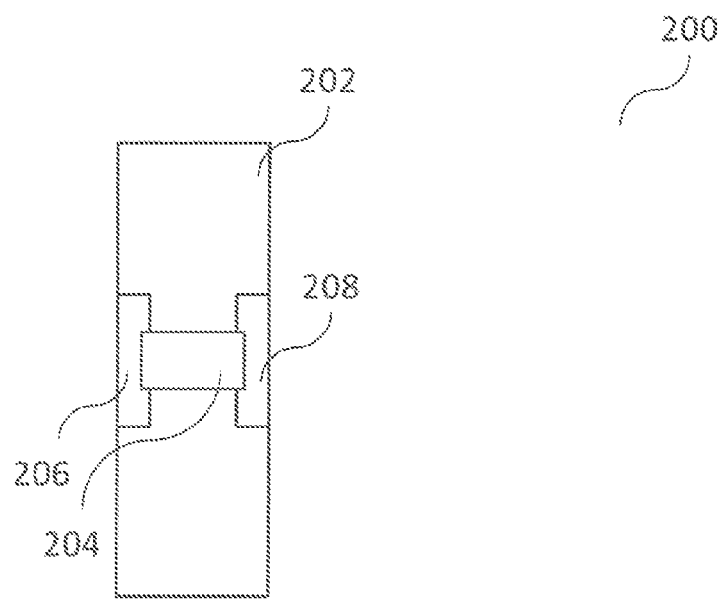
FIG. 2 shows a direct feed through connection through the He-sealed enclosure for direct data transfer according to various embodiments.

Embodiments described below in context of the devices are analogously valid for the respective methods, and vice versa. Furthermore, it will be understood that the embodiments described below may be combined, for example, a part of one embodiment may be combined with a part of another embodiment.

The amount of data to be stored on data storage devices is increasing. Thus, it may be desired to provide data storage devices with a high data storage capacity. One approach to increasing the amount of data that may be stored in hard disk drives may be to provide Helium-filled hard disk drives.

According to various embodiments, a connector, for example a direct data connector for a sealed He-filled (Helium-filled) Wi-Fi external drive enclosure may be provided.

According to various embodiments, a method may be provided to make (or to produce) a feed through data connection through the He-seal of the Wi-Fi external HDD (hard disk drive) enclosure. Direct data connection may be desired for a sealed HDD, for example because Wi-Fi data rate may be insufficient for data transfer. Direct feed through data connection may be one option. An inductively coupled data connection may be another option and may be desired to be very small and in close proximity to support the high data rate (just like the writer in the recording head). Fabrication of this kind of device may be possible, but complexity may make it expensive. A fiber optical data connection may be the most expensive option, as it may be basically a whole optical transponder.

FIG. 1A shows a flow diagram 100 illustrating a method for forming a direct data connector for a sealed device according to various embodiments. In 102, a substrate with a hole may be provided. In 104, the hole may be filled with a filling material using a plating process.

In other words, according to various embodiments, a direct data connector for a sealed device (for example a hard disk drive) may be provided by filling a through hole in a substrate using plating.

According to various embodiments, the method may further include planarizing the plated filling material.

According to various embodiments, the method may further include: providing a wire of the filling material in the hole before filling the hole with the filling material using the plating process.

According to various embodiments, the substrate may include or may be aluminium oxide ($Al_2O_3$).

According to various embodiments, the filling material may include or may be copper (Cu).

According to various embodiments, the method may further include: forming an inductive coupling in the filling material.

According to various embodiments, the method may further include: forming a soft magnetic core in the substrate.

According to various embodiments, the method may further include: forming a coil in the filling material.

According to various embodiments, the substrate may include or may be copper.

According to various embodiments, the filling material may include or may be a magnetic material.

According to various embodiments, the substrate may include at least one groove, for example an O-ring groove.

FIG. 1B shows a direct data connector 106 for a sealed device (not shown) according to various embodiments. The direct data connector 106 may include a substrate 108. The direct data connector 106 may further include a filling 110 in a hole of the substrate 108. The filling 110 may be formed using a plating process (for example to fill the hole of the substrate 108). The substrate 108 and the filling 110 may be coupled with each other, like indicated by a line 112, for example electrically coupled, for example using a line or a cable, and/or mechanically coupled.

According to various embodiments, the substrate 108 may include or may be aluminium oxide ($Al_2O_3$).

According to various embodiments, the filling 110 may include or may be copper (Cu).

FIG. 1C shows a direct data connector 114 for a sealed device according to various embodiments. The direct data connector 114 may, similar to the direct data connector 106 of FIG. 1B, include a substrate 108. The direct data connector 114 may, similar to the direct data connector 106 of FIG. 1B, further include a filling 110 in a hole of the substrate 108. The direct data connector 114 may further include an inductive coupling 116, like will be described in more detail below. The direct data connector 114 may further include a soft magnetic core 118, like will be described in more detail below. The direct data connector 114 may further include a coil 120, like will be described in more detail below. The substrate 108, the filling 110, the inductive coupling 116, the soft magnetic core 118, and the coil 120 may be coupled with each other, like indicated by a lines 122, for example electrically coupled, for example using a line or a cable, and/or mechanically coupled.

According to various embodiments, the inductive coupling 116 may be provided in the filling 110.

According to various embodiments, the soft magnetic core 118 may be provided in the substrate 108.

According to various embodiments, the coil 120 may be provided in the filling 110.

According to various embodiments, the substrate 108 may include or may be copper.

According to various embodiments, the filling 110 may include or may be a magnetic material.

According to various embodiments, the substrate 108 may include at least one groove.

According to various embodiments, the filling 110 may be configured to provide a feed through connection and/or an inductively coupled data connection and/or an optically coupled data connection.

A He-filled sealed Wi-Fi external drive may be a new concept. However, Wi-Fi data rate is in the region of tens of Mb/s (Mega bit per second), while USB data rate is in the region of Gb/s (Giga bit per second). Wi-Fi data rate may be enough for broadcast, but too low for data transfer from/to a host computer. Furthermore, high data transfer rate may be required during drive self test.

According to various embodiments, a direct data connection going through the He-seal, for example of a hard disk drive, may be provided, for example in addition to a Wi-Fi interface or instead of any other interface (in other words: as a sole interface).

A direct data connection according to various embodiments may be: a feed through connector; an inductively coupled data connection; and/or an optically coupled data connection.

FIG. 2 shows a direct feed through connection 200 through the He-sealed enclosure for direct data transfer (for example shown in a cross-sectional view) according to various embodiments. The feed through 200 may be made from an $Al_2O_3$ plate 202. The feed through 200 may include (or may provide) electrical contact. The electrical contact may be made from a Cu (copper) core 204, and the end portions of the electrical contact may include for example a first electrical contact 206 and a second electrical contact 208. A process flow for producing the direct feed through will be described in more details below. According to various embodiments, there may be multiple Cu cores for multiple data channels.

FIG. 3A to FIG. 3D show various stages of a process (for example a process to make or to produce the connector) and design of the He-sealed direct data connector according to various embodiments (for example shown in a cross-sectional view). The size of the He-sealed direct data connector according to various embodiments (which for example may be referred to as a connector pin, wherein here for simplicity of illustration we just one pin is described) may be in the range of about 100 um to about 1000 um. The HDD enclosure may for example have dimension of about 120 mm×100 mm×20 mm. It will be understood that although only one connector pin is described, there may be provided a plurality of connector pins according to various embodiments.

Figure 3A:
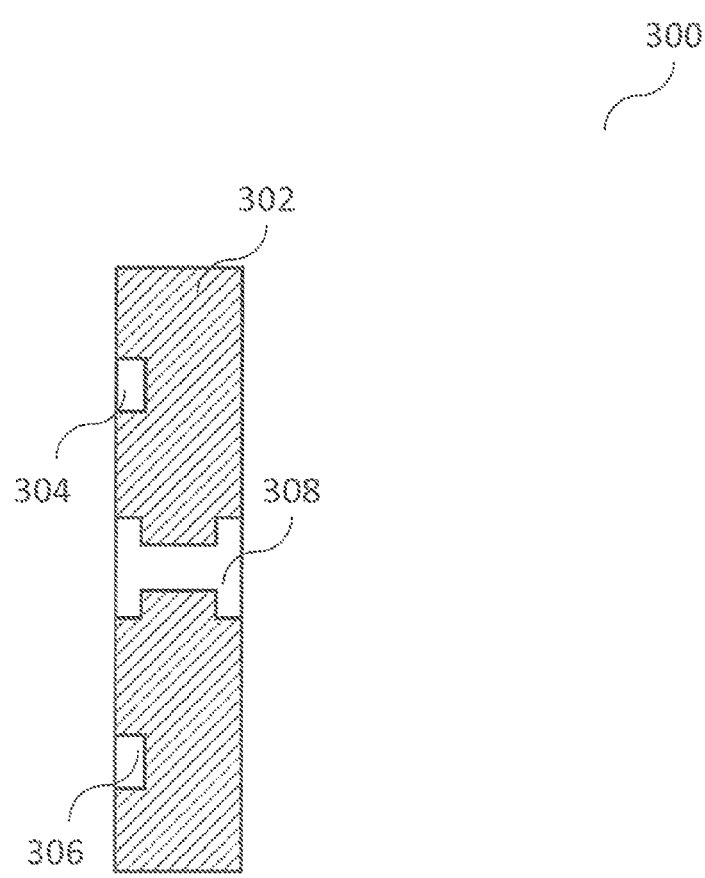
FIG. 3A to FIG. 3D show various stages of a process and design of the He-sealed direct data connector according to various embodiments.

FIG. 3A shows a first stage 300 of forming a connector according to various embodiments. The connector may include a substrate (for example a block 302), for example an $Al_2O_3$ block, with pre-formed features, for example with a hole 308 (for example a hole with rims), a first O-ring groove 304, and a second O-ring groove 306. It will be understood that more than one hole may be provided. It will be understood that any number of pre-formed features may be provided. The O-ring groove 304, 306, and hole 308 with rim may be pre-formed onto the $Al_2O_3$ block 302. It will be understood that what is described here is the connector block. An O-ring (which may engage with the O-ring groove 304, 306) may be configured for mounting the connector block onto the HDD enclosure with seal.

Figure 3B:
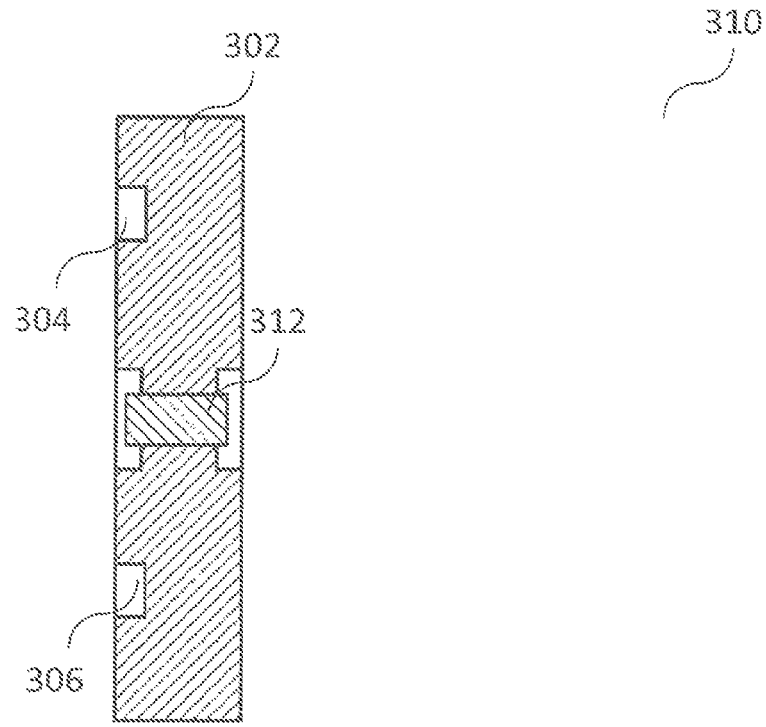

FIG. 3B shows a second stage 310 of forming a connector according to various embodiments. In the hole 308, a wire of a filling material (for example a Cu (copper) wire 312) may be provided (or plugged), and the Cu wire 312 may be cut flush.

Figure 3C:
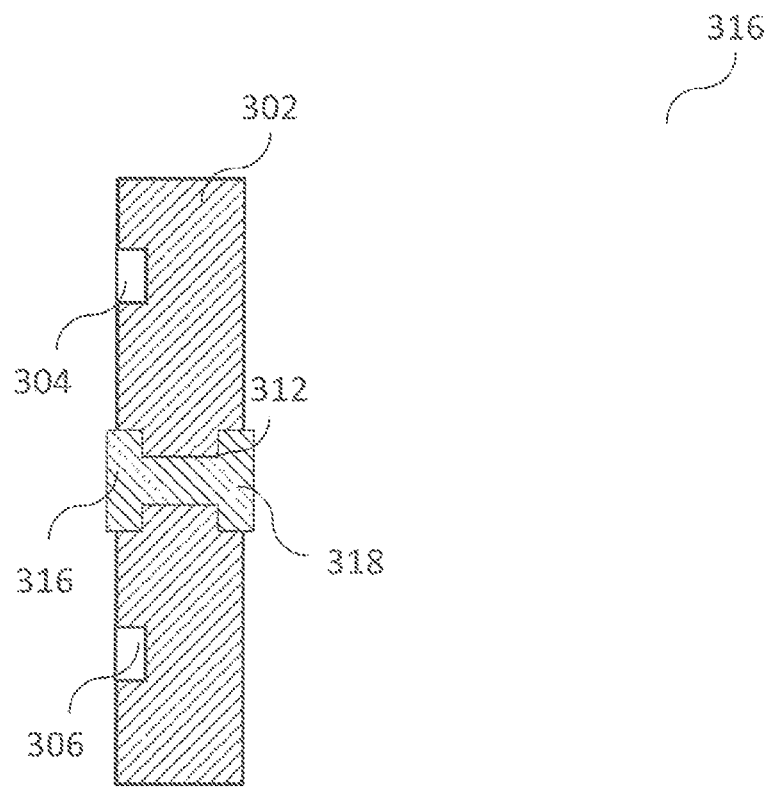

FIG. 3C shows a third stage 316 of forming a connector according to various embodiments. Cu (copper) may be plated in the hole 308 where the wire 312 is provided, to fill the hole 308 and to seal the hole 308. The plated copper 316 and 318 may protrude out from the block 302. Although Cu plating may be a common process as such on various substrates, plating to completely fill and seal the small (for example sub mm) size hole 308 (so as to ensure that there is no leak to He (Helium)) may be a challenge, and hence the wire 312 (or wire plug) may be provided to ease the fill according to various embodiments.

Figure 3D:
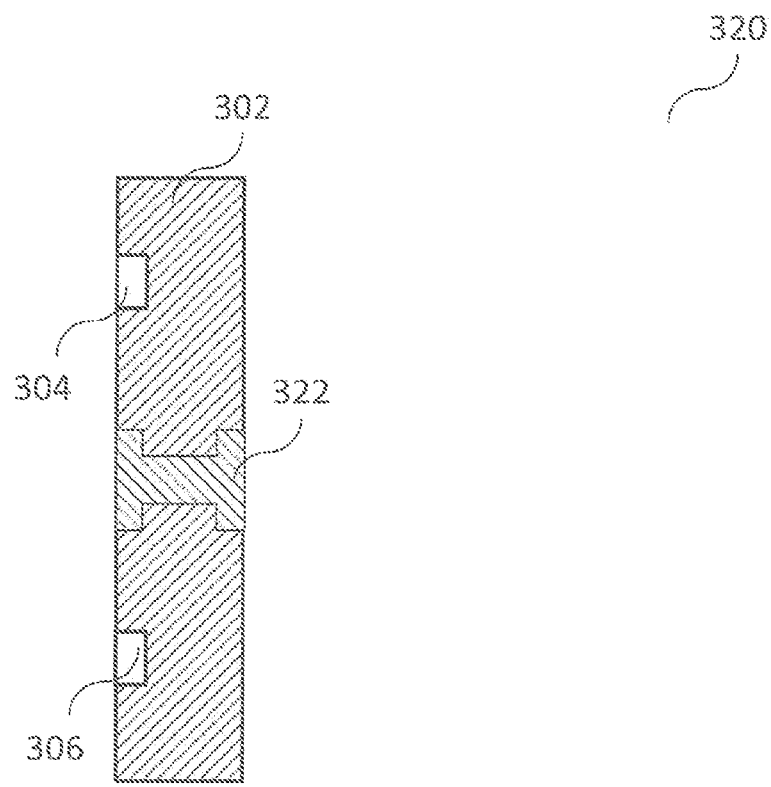

FIG. 3D shows a fourth stage 320 of forming a connector according to various embodiments. The protruding plated copper 316 and 318 may be polished to planarize, so as to get a planar seal 322 (where previously the hole 308 has been).

According to various embodiments, a connector may be provided which may provide a high data rate with its small size. The connector illustrated in FIG. 4 may be considered an alternative to the connector illustrated in FIG. 3, with a possibility of a sealing advantage.

According to various embodiments, a method may be provided for producing a seal. A similar method may also be used for producing a writer in the recording head. In other words, according to various embodiments, the inductive concept for the connector illustrated in FIG. 3 may be formed using manufacturing techniques that are used to make the recording head.

FIG. 4A to FIG. 4D show various stages of an inductively coupled data connector according to various embodiments (for example shown in a cross-sectional view). The inductively coupled data connect may support a high data rate. The size of the inductive connector may be less than 100 um.

Figure 4A:
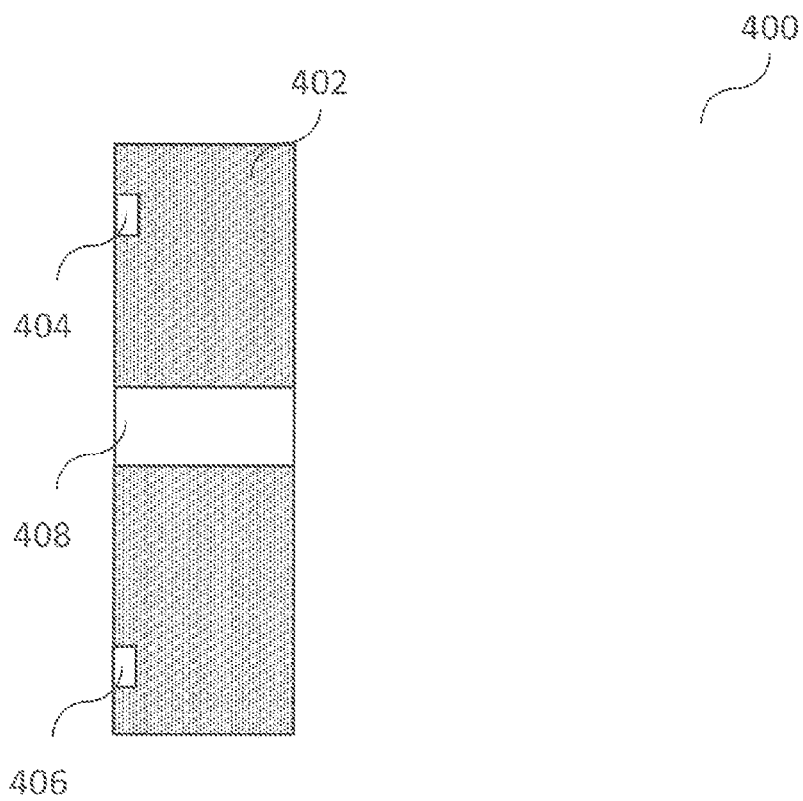

FIG. 4A shows a first stage 400 of forming an inductively coupled data connector according to various embodiments. A substrate (for example a Cu (copper) plate 402) with pre-formed features may be provided. For example, the Cu plate 402 may be provided with a hole 408, a first O-ring groove 404, and a second O-ring groove 406. It will be understood that more than one hole may be provided. It will be understood that any number of pre-formed features may be provided.

Figure 4B:
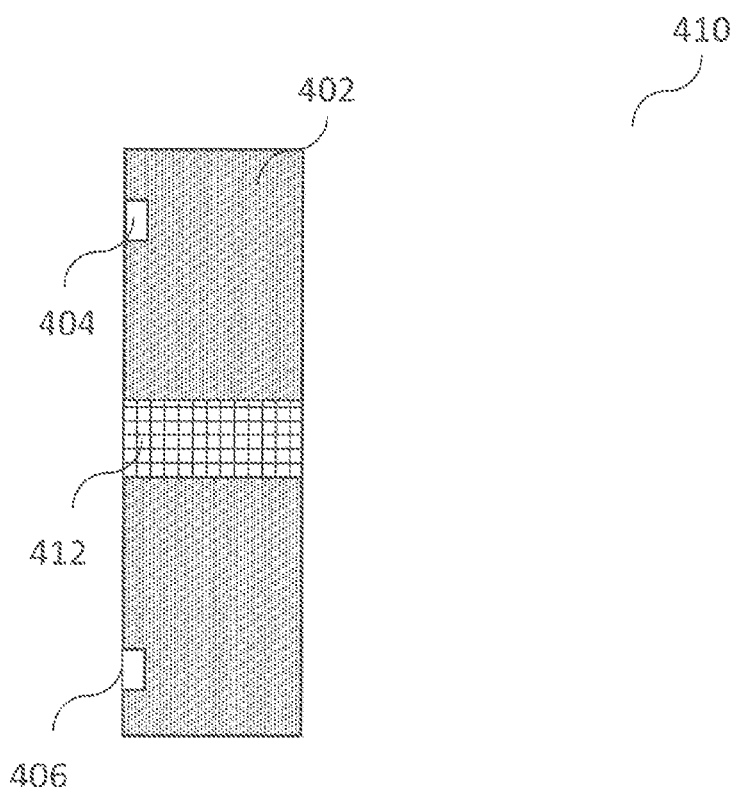

FIG. 4B shows a second stage 410 of forming an inductively coupled data connector according to various embodiments. The hole 408 may be filled with a filling material, for example with a soft magnetic core 408, for example using a plating and planarization process.

Figure 4C:
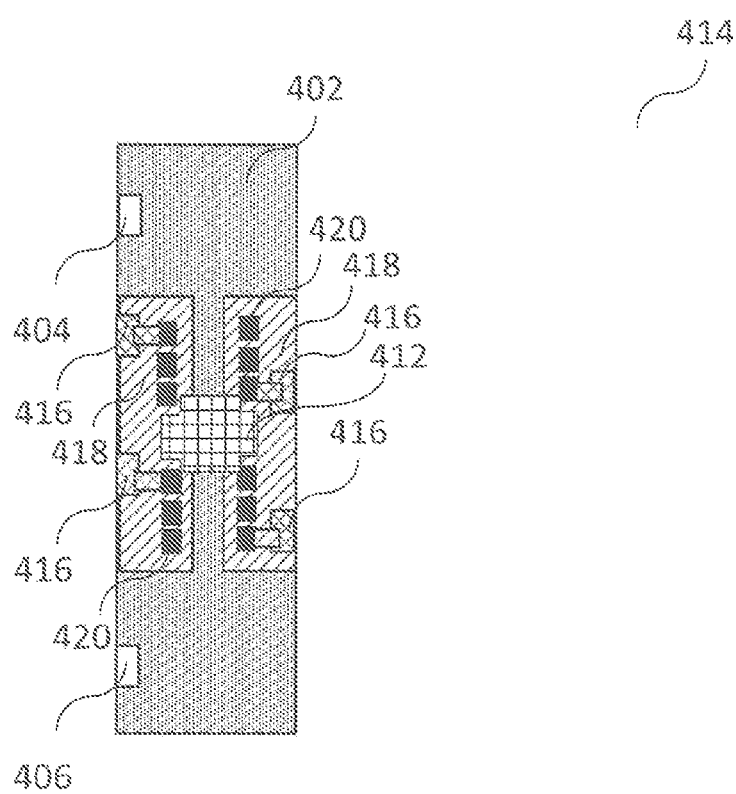

FIG. 4C shows a third stage 414 of forming an inductively coupled data connector according to various embodiments. The soft magnetic core 412, two coils 420 (for example a first coil and a second coil), and contacts 416 (for example metal contacts and vias) may be formed in a $SiO_2$ (Silicon dioxide) filling 418 using IC (integrated circuit) processes. According to various embodiments, manufacturing techniques that are used to make the recording head may be used for forming the inductively coupled data connector according to various embodiments.

FIG. 4D shows an illustration 422 of the various textures used for illustrating the portions of the stages of forming an inductively coupled data connector according to various embodiments in FIG. 4A to FIG. 4C. A cross-sectional view 420(1) and a top view 420(2) of the metal coil 420 are shown. For example, FIG. 4D shows the top view of the various components that are shown in FIG. 4C.

The method according to various embodiments may use IC (integrated circuit) processes, in other words: may use processes which may also be used for producing integrated circuits. According to various embodiments, plate and fill of a soft magnetic core into the hole may be provided.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for forming a direct data connector for a sealed device, the method comprising:
   providing a substrate with (i) a hole formed through the substrate from a first surface of the substrate to a second surface of the substrate, (ii) a first rim section that is recessed relative to the first surface of the substrate and that is located around the hole, and (iii) a second rim section that is recessed relative to the second surface of the substrate and that is located around the hole;
   inserting a wire of a filling material into the hole, the wire contacting inner walls of the hole and plugging the hole;
   after the insertion of the wire of the filling material into the hole, cutting the wire of the filling material flush with the first and second surfaces of the substrate;
   after cutting the wire flush with the first and second surfaces of the substrate, filling the hole and the first and second rim sections with the filling material using a plating process; and
   after filling the hole and the first and second rim sections with the filling material using the plating process, planarizing the plated filling material.

2. The method of claim 1,
   wherein the substrate comprises aluminium oxide.

3. The method of claim 1,
   wherein the filling material comprises copper.

4. A method for forming a direct data connector for a sealed device, the method comprising:
   providing a substrate with (i) a hole formed through the substrate from a first surface of the substrate to a second surface of the substrate, (ii) a first rim section that is recessed relative to the first surface of the substrate and that is located around the hole, and (iii) a second rim section that is recessed relative to the second surface of the substrate and that is located around the hole;
   plugging the hole by inserting a wire of a filling material into direct contact with inner surfaces of the hole;
   after the plugging of the hole with the wire of the filling material, cutting the wire of the filling material flush with the first and second surfaces of the substrate;
   after cutting the wire flush with the first and second surfaces of the substrate, filling the hole and the first and second rim sections with the filling material using a plating process; and
   after filling the hole and the first and second rim sections with the filling material using the plating process, planarizing the plated filling material.

* * * * *